United States Patent [19]

Komeya et al.

[11] Patent Number: 4,756,976
[45] Date of Patent: Jul. 12, 1988

[54] CERAMIC WITH ANISOTROPIC HEAT CONDUCTION

[75] Inventors: Katsutoshi Komeya, Kanagawa; Akihiko Tsuge, Yokohama, both of Japan

[73] Assignee: Kabushiki Kaisha Toshiba, Kawasaki, Japan

[21] Appl. No.: 82,992

[22] Filed: Aug. 7, 1987

Related U.S. Application Data

[63] Continuation of Ser. No. 915,965, Oct. 6, 1986, abandoned, which is a continuation of Ser. No. 655,427, Sep. 28, 1984, abandoned.

[30] Foreign Application Priority Data

Sep. 30, 1983 [JP] Japan .................................. 58-182739

[51] Int. Cl.$^4$ ............................................. B32B 15/04
[52] U.S. Cl. .................................... 428/698; 428/699; 428/156; 428/163; 428/701; 428/164
[58] Field of Search ............... 428/698, 699, 701, 156, 428/161, 163, 164, 167

[56] References Cited

U.S. PATENT DOCUMENTS

| | | |
|---|---|---|
| 3,716,759 | 2/1973 | Scare . |
| 4,256,792 | 3/1981 | Koepke et al. . |
| 4,312,899 | 1/1982 | Tahmann ..................... 428/446 X |
| 4,336,304 | 6/1982 | Tandingham et al. ......... 428/446 X |
| 4,336,305 | 6/1982 | Tanaka ........................ 428/698 X |
| 4,492,765 | 1/1985 | Buljan ......................... 428/446 X |

FOREIGN PATENT DOCUMENTS

| | | | |
|---|---|---|---|
| 0153756 | 12/1979 | Japan | ................................ 428/698 |
| 0101889 | 6/1984 | Japan | ................................ 428/698 |

OTHER PUBLICATIONS

EP 0107571, May 1974, Turpin-Launay.

Primary Examiner—Nancy A. B. Swisher
Attorney, Agent, or Firm—Oblon, Fisher, Spivak, McClelland & Maier

[57] ABSTRACT

A ceramic with anisotropic thermal conductivity, which has an aluminum nitride polytype layer arranged in a portion of an aluminum-nitride-based sintered body as a thermal barrier.

4 Claims, 4 Drawing Sheets

F I G. 1C
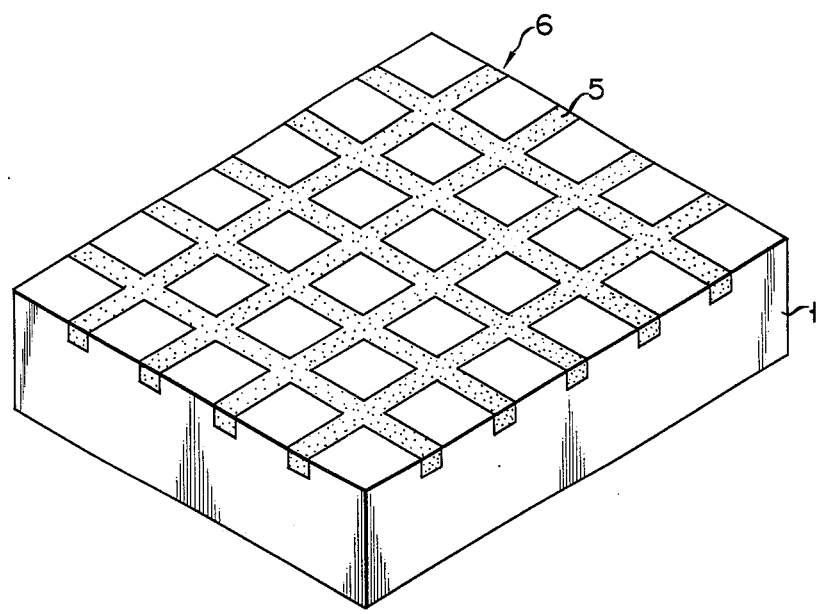
F I G. 1D
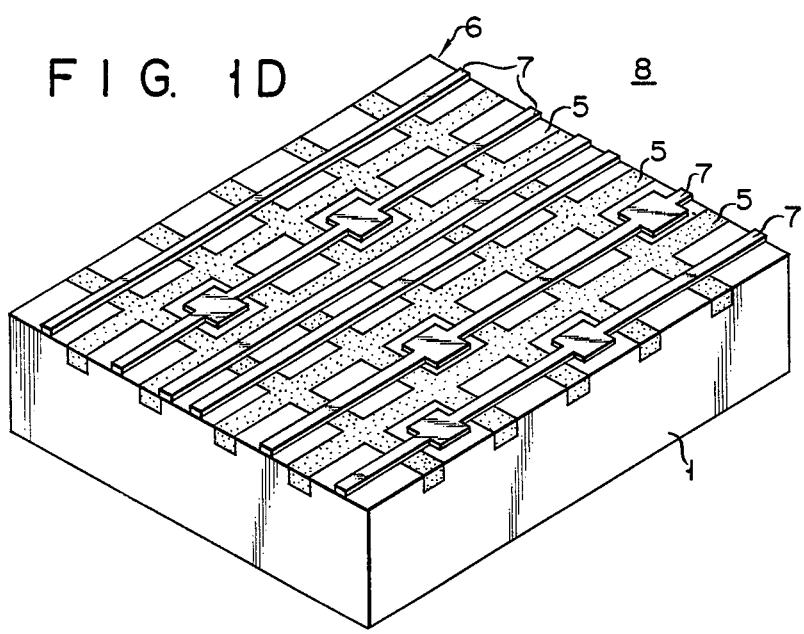

CERAMIC WITH ANISOTROPIC HEAT CONDUCTION

This application is a continuation of Ser. No. 915,965, filed on Oct. 6, 1986, now abandoned, which is a continuation of application Ser. No. 655,427, filed Sept. 28, 1984, now abandoned.

BACKGROUND OF THE INVENTION

This invention relates to a ceramic with anisotropic heat conduction and, in particular, to such a ceramic consisting of an aluminum-nitride-based (AlN-based) sintered body and a layer of a polytype of aluminum nitride.

AlN-based sintered body has excellent heat, corrosion and heat-shock resistance, as well as thermal conductivity, so it is used as material for high temperature applications. One of these uses is as a heat conductive substrate in a semiconductor device, as is disclosed in *Thermal Conductivity of Commercial Aluminum Nitrode.* Ceramic Bulletin, Vol. 51, No. 11 (1972).

SUMMARY OF THE INVENTION

The purpose of this invention is to provide a ceramic with anisotropic thermal conductivity, which is formed of a high conductivity AlN-based sintered body and a layer of a polytype of AlN as a thermal barrier, which has thermal conductivity inferior to that of the AlN-based sintered body, and which has improved conformability (matching) at the boundaries of the AlN-based sintered body and the polytype AlN layer.

Another purpose of this invention is to provide a heat conductive substrate with anisotropic thermal conductivity that is constructed of high conductivity AlN-based sintered body and a layer of a polytype of AlN as a thermal barrier, which has inferior thermal conductivity to that of the AlN-based sintered body.

Another purpose of this invention is to provide a circuit board with anisotropic thermal conductivity that is constructed of an insulation substrate formed of a high conductivity AlN-based sintered body and a layer of a polytype of AlN as a thermal barrier which has inferior thermal conductivity to that of the AlN-based sintered body and signal wire strips and large current supply wire strips, which are formed in regions of the insulation substrate that are separated from the AlN polytype layer.

Another purpose of this invention is to provide a circuit board with anisotropic thermal conductivity that is constructed of an insulation board formed of a high conductivity AlN-based sintered body and a layer of a polytype of AlN as a thermal barrier which has inferior thermal conductivity to that of the AlN-based sintered body and wiring strips formed in the insulation board, and which is equipped with semiconductor elements, which generate heat such as power transistors, and passive elements such as resistors and capacitors.

According to this invention, a ceramic is provided with anisotropic thermal conductivity and has a layer of a polytype of AlN arranged in a portion of the AlN-based sintered body as a thermal barrier.

Examples of the polytype of AlN that can be used are crystalline structures of the Al—O—N system and the Al—Si—O—N system.

The following is a description of the method of manufacturing the ceramic with anisotropic thermal conductivity accoring to this invention.

(1) After filling a mold with AlN-based powder and filling the portion that is to be the thermal barrier with an Al—Si—O—N system powder, a hot press is applied, producing a ceramic with anisotropic thermal conductivity. The same effect, in this case, can be produced with the substitution of an Al—O—N system or Al—Si—N system powder for the Al—Si—O—N system powder, or by mixing oxygen or silicon into the AlN.

(2) After forming a silicon or silicon oxide film over part or all of an AlN-based sintered body, heat treatment is performed in a nitrogen atmosphere so that the AlN-based sintered body and the silicon or silicon oxide film react. A layer of a polytype of AlN is formed in the portion of the AlN-based sintered body surface that is to be the thermal barrier.

In the second method, there are various methods by which the silicon or silicon oxide film may be formed on part of the AlN-based sintered body. One of the methods is to form a silicon or silicon oxide film over the whole surface of the AlN-based sintered body using a CVD or sputtering method and then forming the desired resist pattern on this film using a photoengraving process (PEP). This resist pattern is used as a mask to selectively etch the film so that a silicon or silicon oxide film pattern is formed on part of the sintered body. It is also possible in this case to use a vacuum deposition method for depositing the silicon film. A second possible method is to arrange a mask between the AlN-based sintered body and the silicon or silicon oxide target, and then to form a silicon or silicon oxide film pattern on the sintered body by sputtering. A third possible method is to provide a resist pattern spacer formed beforehand on the AlN-based sintered body using PEP and then depositing a film of silicon or silicon oxide on a sintered body which includes this spacer. Next, this spacer is removed and the silicon or silicon oxide film is lifted off to form the silicon or silicon oxide film pattern.

In the heat treatment of the second method it is necessary to form a layer of polytype of AlN to sufficiently promote the reaction of the AlN-based sintered body and the silicon or silicon oxide film. Consequently, it is desireable to have temperatures in a range over 1500° C. but under the decomposition temperature (melting point) of AlN.

(3) After forming a silicon or silicon oxide film over part or all of an AlN-based mold, heat treatment is performed in a nitrogen atmosphere to sinter the AlN-based mold and to cause this mold to react with the silicon or silicon oxide film so that a layer of a polytype of AlN is formed in the portion of the AlN-based sintered body surface that is to become the thermal barrier.

In this third method, after CaO, BaO or SrO, etc. is added to the AlN-based powder as a sintering agent and a binder is added, the material is shaped. The heat treatment used is for sufficienty sintering the AlN-based mold and for causing a sufficient reaction between the AlN-based mold and the silicon or silicon oxide film and forming a layer of a polytype of AlN. A temperature range of over 1700° C. but under the decomposition temperature of AlN is desireable.

(4) After selective ion implantation of silicon, oxygen, or silicon and oxygen into the portion of the AlN-based sintered body that is to become the thermal barrier, heat treatment is performed in a nitrogen atmosphere to cause the AlN and Si to react thereby creating a layer of a polytype of AlN. In this method, the heat treatment should be performed in a temperature range of over 1500° C. but under the decomposition temperature of AlN.

(5) After selective ion implantation of silicon, oxygen or silicon and oxygen into the portion of the AlN-based mold that is to become the thermal barrier, heat treatment is performed in a nitrogen atmosphere to sinter the mold and to cause the AlN and Si to react, thereby creating a layer of a polytype of AlN. In this method the heat treatment should be performed in a temperature range of over 1700° C. but under the decomposition temperature of AlN.

BRIEF DESCRIPTION OF THE DRAWING

FIGS. 1A to 1D are perspective views of the manufacturing process of the circuit board shown in example 1 of this invention;

DETAILED DESCRIPTION OF THE PREFERRED EMBODIMENT

EXAMPLE 1

Figure 1A:
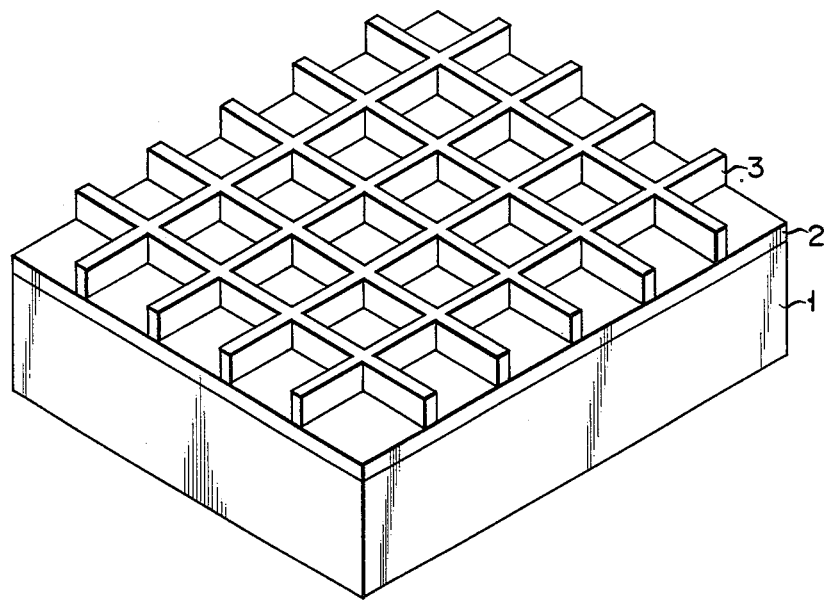
Figure 1B:
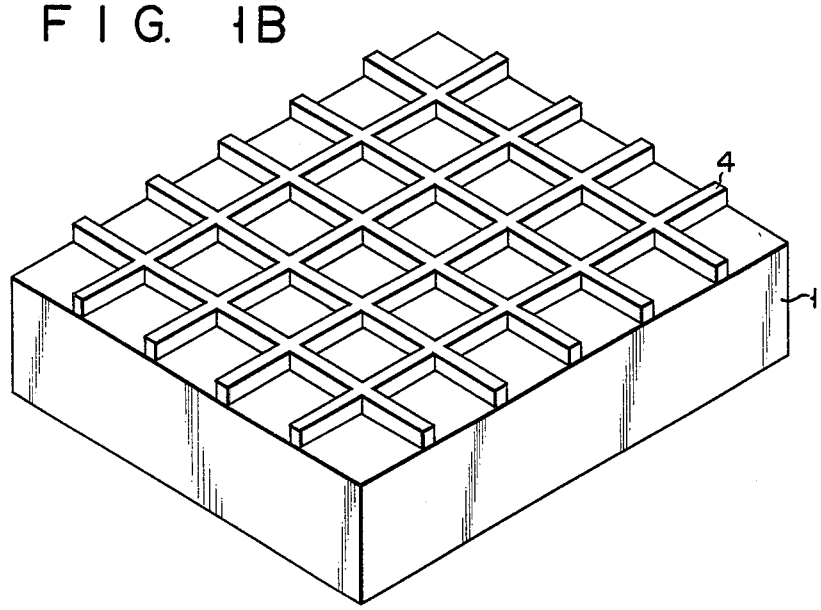

As shown in FIG. 1, after a SiO film 2 was deposited to a depth of 1 μm on the high-density AlN sintered body 1 by CVD, a lattice-shaped resist pattern 3 was formed on the $SiO_2$ film 2 by PEP. Next, as shown in FIG. 1B, the $SiO_2$ film was selectively etched using resist pattern 3 as a mask to form a lattice-shaped $SiO_2$ film pattern. After this was completed, the resist pattern 3 was removed.

Then, in a nitrogen atmosphere, the AlN sintered body 1 was heat treated for 30 minutes at a temperature of 1750° C.. As shown in FIG. 1C, the $SiO_2$ film pattern 4 and the AlN sintered body 1 react forming a heat conductive insulating substrate 6, which has a lattice-shaped layer 5 of a polytype of AlN, on the surface of the sintered body 1. Next, as shown in FIG. 1D, wiring strips 7 were formed on the insulating substrate 6 by a thick-film printing technique to form the circuit board 8.

Based on the results of a test of the ingredients of the AlN polytype layer 5 on the insulating subustrate 6 of the circuit board 8, it was confirmed that the ingredients were Al, Si, O and N. The heat transmission ratio of the AlN polytype layer 5 was also determined to be about $\frac{1}{3}$ that of the AlN sintered body 1.

Also, a plurality of power transistors were mounted in the locations corresponding to the square spaces of the AlN polytype layer 5 on the circuit board 8. The heat from the transistors was dissipated well, and thermal interference between adjoining transistors was prevented by the lattice-shaped AlN polytype layer 5.

EXAMPLE 2

First, a silicon film was deposited on an AlN-based mold, which included a small amount of a sintering agent such as CaO, by a sputtering technique, the target of which was silicon. Next, after a lattice-shaped resist pattern had been formed on the silicon film by PEP, the silicon film was selectively etched using the resist pattern as a mask to form a lattice-shaped silicon film pattern.

The resist pattern was next removed after which the AlN-based mold was heat treated at 1750° C. in a nitrogen atmosphere for two hours to sinter the AlN-based mold and to cause the sintered body to react with the silicon pattern, forming a heat conductive insulating substrate, which has a lattice-shaped AlN polytype layer, on the surface of the AlN-based sintered body. Next, wiring strips were formed on the insulating substrate using a thick-film printing technique to thereby form the circuit board.

This example was shown to have virtually the same characteristics as that of example 1.

EXAMPLE 3

A resist pattern with an opening over the portion that was to become the thermal barrier was formed on the high-density AlN sintered body using a PEP. Then, silicon and oxygen were selectively ion implanted using the resist patptern as a mask, and the resist pattern was removed.

Figure 2:
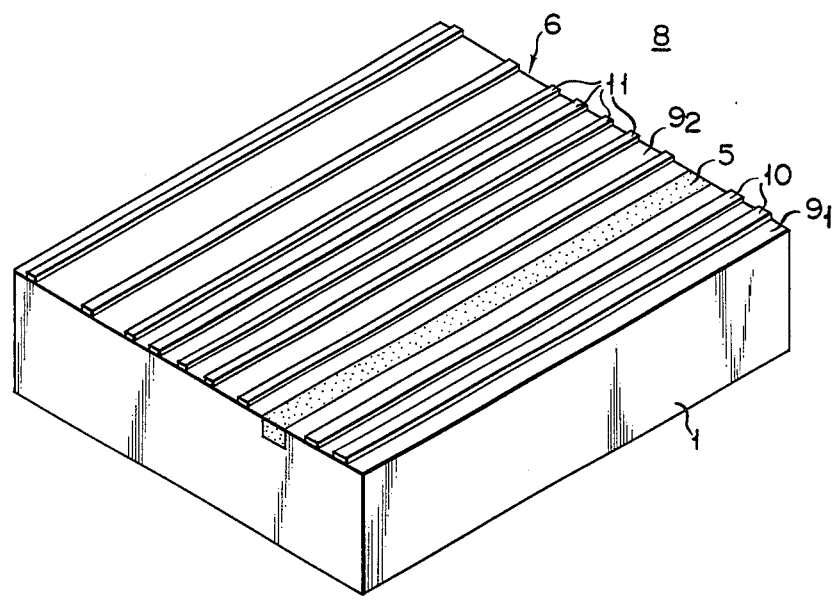
FIG. 2 is a perspective view showing the circuit board of example 3.

Next, the AlN sintered body was heat treated in a nitrogen atmosphere at 1750° C. for thirty minutes. The ion implanted silicon and oxygen react with the sintered body and an AlN polytype layer was formed on the surface of the AlN sintered body to form a heat conductive insulating substrate. Then, circuit board 8 shown in FIG. 2 was made in which large current supply wiring strips 10 were formed in region $9_1$, which was separated by AlN polytype layer 5 on insulating substrate 6, and signal wiring strips 11 were formed in the other region $9_2$, by using a thick-film printing technique.

Based on the test performed, it was determined that the ingredients of the AlN polytype layer 5 of the insulating substrate 6 of the circuit board 8 consisted of Al, Si, O and N. It was found that the thermal conductivity of the AlN polytype layer 5 was $\frac{1}{3}$ that of the AlN sintered body 1.

A hybrid IC was made with specified transistors, resistors and capacitors on the resultant circuit board 8. When a voltage was applied to the large current supply wiring strips 10 and the IC operated, the heat generated by the large current supply wiring strips 10 was favourably dissipated and thermal interference between the adjoining signal wiring strips 11 was prevented by the lattice-shaped AlN polytype layer 5.

EXAMPLE 4

Figure 3:
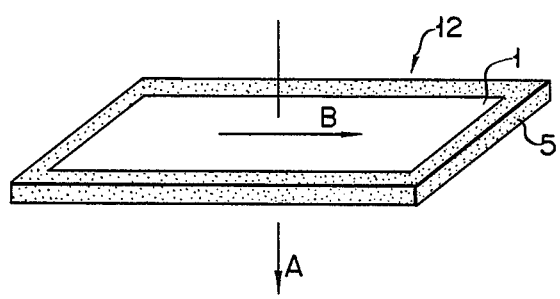
FIG. 3 is a perspective view of a heat conductor board of example 4.

A mold was filled with AlN powder and, after an Al—Si—O—N system powder was filled around the outside of the AlN powder to form a frame, a hot press was applied to form a heat conductive substrate 12, which has an AlN polytype layer 5 formed as a frame around the AlN sintered body 1, as is shown in FIG. 3.

When the thermal conductivity of the resultant heat conductive substrate 12 was measured, it was found to be 62 W/mk in the direction of the thickness (direction A in the drawing) and 20 W/mk in the planar direction (direction B in the drawing) and a thermal anisotropy of 3:1. The matchability of the AlN sintered body 1 and the AlN polytype layer 5 was good and the mechanical strength was satisfactory.

When a plurality of power transistors was mounted on the heat conductive substrate 12, a semiconductor module, which showed excellent heat dissipation characteristics in the direction of the thickness and in which the heat conductivity in the planar direction was suppressed by the AlN polytype layer 5 frame, was obtained.

The ceramics with anisotropic thermal conductivity of this invention are not limited to the circuit board or heat conductive substrate described in the above examples and may be applied to members shaped as shown in FIGS. 4 to 7.

Figure 4:
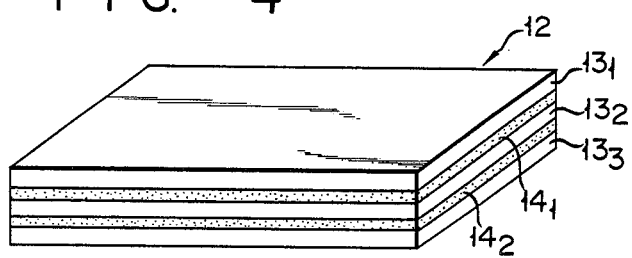
FIG. 4 is a perspective view of another heat conductor board.

FIG. 4 shows a heat conductive substrate 12, which is constructed of two AlN polytype layers $14_1$ and $14_2$ separately sandwiched between three AlN sintered layers $13_1$ to $13_3$. With this kind of heat conductive substrate, the heat conductivity is low in the direction of the thickness because of the AlN polytype layers $14_1$ and $14_2$ but high in the planar direction of the AlN sintered layers $13_1$ to $13_3$.

Figure 5:
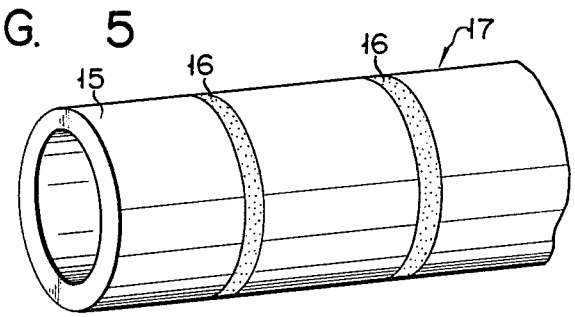
FIG. 5 is a perspective view of a heat transmission medium of another example.

FIG. 5 shows a thermal conduction medium 17 in which an AlN sintered cylinder 15 has a plurality of rings 16 made of an AlN polytype interposed at set intervals. With this kind of thermal conductive medium 17, the heat conductivity in the radial direction perpendicular to the axis is high while in the axial direction it is low because of the AlN polytype rings 16.

Figure 6:
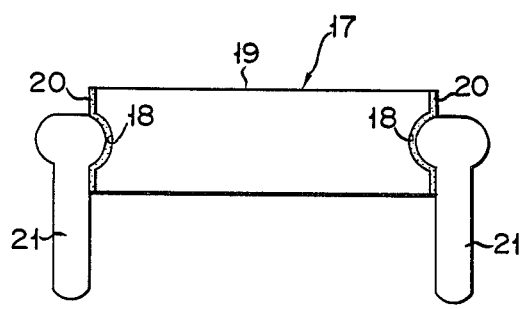
FIG. 6 is a front view of a heat transmission medium of another example.

FIG. 6 shows a thermal conduction medium 17, which is constructed as an AlN sintered block 19 with depressions 18 in the outer surface and AlN polytype layers 20 arranged in the outer surface of the AlN block 19. With this kind of thermal conduction medium 17, the heat conductivity is high in the direction of the thickness and low in the planar direction, providing the so-called thermal conduction anisotropy. When thermal conduction medium 17 is used in a high temperature application, it is possible to support the medium 17 without deterioration in metal supports 21 due to heat by fitting the metal supports 21 in the AlN polytype layers 20.

Figure 7:
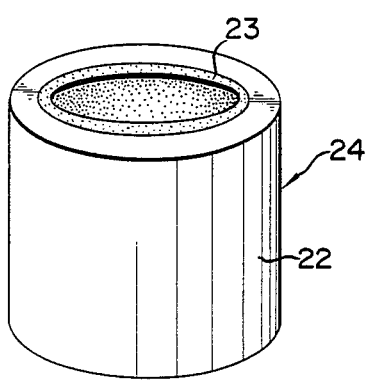
FIG. 7 is a perspective view of heat resistant container of another example.

FIG. 7 shows a heat resistive container 24 in which an AlN polytype layer 23 is arranged on the inner surface of an AlN sintered cylinder 22, which has a bottom. With this kind of heat resistive container the heat conductivity is high in the vertical direction and low in the horizontal direction facing from the outside to the center.

As was described above, according to this invention it is possible to provide a ceramic with anisotropic thermal conductivity, which is formed of a high thermal conductive AlN-based sintered body and an AlN polytype layer, which has inferior thermal conductivity to the AlN-based sintered body to thereby act as a thermal barrier, and which has good matching at the boundaries of the AlN-based sintered body and the AlN polytype layer. It is also possible to provide various mechanical members which have anisotropic thermal conductivity, such as circuit boards suitable for hybrid IC, heat conductive substrates, as well as heat conductive members and heat resistive containers, etc.

What is claimed is:

1. An insulation substrate comprising:
    a lattice structure of polytype aluminum nitride selected from a group consisting of Al—Si—O—N, Al—O—N and Al—Si—N as a thermal barrier in a heat conductive, insulating substrate of sintered aluminum nitride.
2. The ceramic according to claim 1, wherein the aluminum nitride polytype has a crystalline structure of an Al—O—N system.
3. The ceramic according to claim 1, wherein the aluminum nitride polytype has a crystalline structure of an Al—Si—O—N system.
4. A heat conductive substrate in which a polytype aluminum nitride selected from the group consisting of Al—Si—O—N, Al—O—N and Al—Si—N as a thermal barrier is provided as a lattice structure on top of a heat conductive, sintered aluminum-nitride body.

* * * * *